(12) United States Patent
Deguenther et al.

(10) Patent No.: US 10,394,129 B2
(45) Date of Patent: Aug. 27, 2019

(54) MICROLITHOGRAPHIC ILLUMINATION UNIT

(71) Applicant: Carl Zeiss SMT GmbH, Oberkochen (DE)

(72) Inventors: Markus Deguenther, Florstadt (DE); Stig Bieling, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/208,662

(22) Filed: Dec. 4, 2018

(65) Prior Publication Data

US 2019/0113849 A1 Apr. 18, 2019

Related U.S. Application Data

(63) Continuation of application No. PCT/EP2017/062748, filed on May 26, 2017.

(30) Foreign Application Priority Data

Jun. 27, 2016 (DE) .................. 10 2016 211 511

(51) Int. Cl.
*G03F 7/20* (2006.01)
*F21V 8/00* (2006.01)

(52) U.S. Cl.
CPC .......... *G03F 7/7015* (2013.01); *G02B 6/0015* (2013.01); *G02B 6/0068* (2013.01);
(Continued)

(58) Field of Classification Search
CPC .... G03F 7/201; G03F 7/2022; G03F 7/70075; G03F 7/7015; G03F 7/7045; G02B 6/0015; G02B 6/0068
See application file for complete search history.

(56) References Cited

U.S. PATENT DOCUMENTS 5,742,362 A * 4/1998 Chikamichi .......... G03F 7/2022
349/2
5,945,680 A 8/1999 Jensen
(Continued)

FOREIGN PATENT DOCUMENTS

DE 10 2014 203 040 A1 8/2015
WO WO 2015/178464 A1 11/2015

OTHER PUBLICATIONS

ISR & Written Opinion for corresponding Appl No. PCT/EP2017/062748, dated Oct. 23, 2017.
(Continued)

*Primary Examiner* — Deoram Persaud
(74) *Attorney, Agent, or Firm* — Fish & Richardson P.C.

(57) ABSTRACT

A microlithographic illumination unit for post-exposure of a photoresist provided on a wafer in a microlithography process, has at least one light source and a light-guiding and light-mixing element for coupling the electromagnetic radiation generated by the light source into the photoresist. This light-guiding and light-mixing element has a first pair of mutually opposite side faces, the maximum spacing of which has a first value. Multiple reflections of the electromagnetic radiation on these side faces take place, wherein the light-guiding and light-mixing element has a second pair of mutually opposite side faces, the maximum spacing of which has a second value. The maximum extent of the light-guiding and light-mixing element in the light propagation direction of the electromagnetic radiation has a third value. This third value is greater than the first value and is smaller than the second value.

20 Claims, 7 Drawing Sheets

(52) U.S. Cl.
CPC ............ *G03F 7/201* (2013.01); *G03F 7/2022* (2013.01); *G03F 7/7045* (2013.01); *G03F 7/70075* (2013.01)

(56) References Cited

U.S. PATENT DOCUMENTS

| | | | | |
|---|---|---|---|---|
| 9,152,040 B1* | 10/2015 | Brueck | ................. | G03F 7/0005 |
| 9,541,799 B2* | 1/2017 | Jing | ...................... | G02F 1/1339 |
| 10,274,843 B2* | 4/2019 | Nagahara | ............ | G03F 7/70775 |
| 2005/0237506 A1* | 10/2005 | Reisinger | ............... | G03B 27/52 |
| | | | | 355/55 |
| 2008/0186474 A1* | 8/2008 | Aschkenasy | ....... | G01M 11/0285 |
| | | | | 356/73 |
| 2008/0230722 A1 | 9/2008 | Elian | | |
| 2009/0290891 A1 | 11/2009 | Sievers | | |
| 2012/0002183 A1* | 1/2012 | Ota | .................... | G03F 7/70291 |
| | | | | 355/67 |
| 2014/0185017 A1 | 7/2014 | Tohara et al. | | |
| 2014/0347643 A1* | 11/2014 | Kotoku | ............... | G03F 7/70558 |
| | | | | 355/52 |
| 2016/0299277 A1* | 10/2016 | Wang | ................... | G02B 6/0003 |
| 2016/0327869 A1* | 11/2016 | Nagahara | ............ | G03F 7/70558 |
| 2016/0357113 A1 | 12/2016 | Deguenther et al. | | |
| 2017/0097570 A1 | 4/2017 | Tagawa | | |
| 2018/0344153 A1* | 12/2018 | Svetliza | ................. | A61B 3/125 |
| 2019/0018170 A1* | 1/2019 | Watanabe | ............ | G02B 3/0006 |
| 2019/0179076 A9* | 6/2019 | Woodgate | ............ | G02B 6/0078 |

OTHER PUBLICATIONS

S. Tagawa et al., "Super High Sensitivity Enhancement by Photo-Sensitized Chemically Amplified Resist (PS-CAR) Process", Journal of Photopolymer Science and Technology, 26, 6, (2013), 825.
GPTO-Office Action, with translation thereof, for corresponding Appl No. DE 10 2016 211 511.1, dated Feb. 2, 2017.
International Preliminary Report on Patentability for corresponding Appl No. PCT/EP2017/062748, dated Jan. 10, 2019.

* cited by examiner

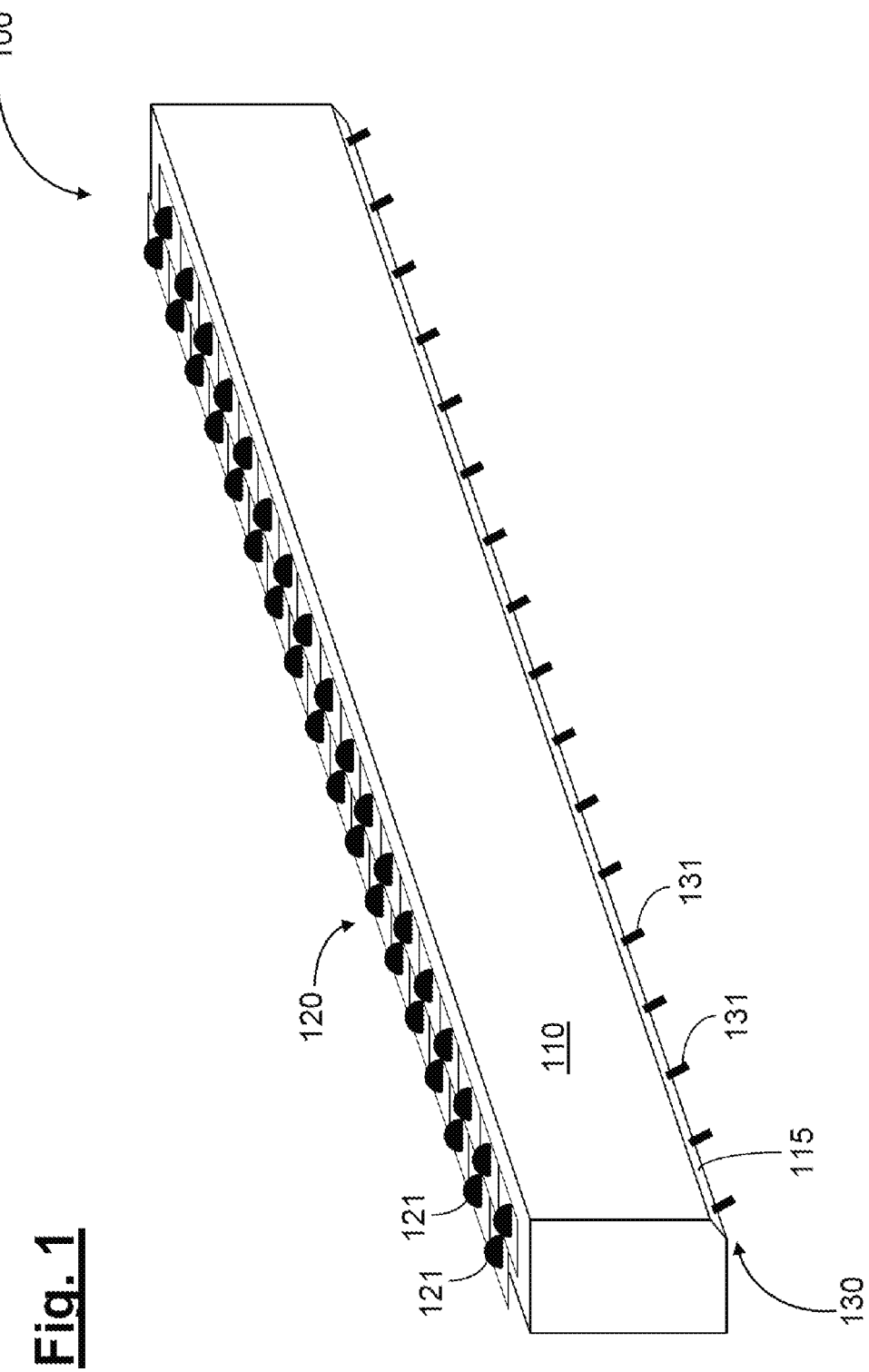

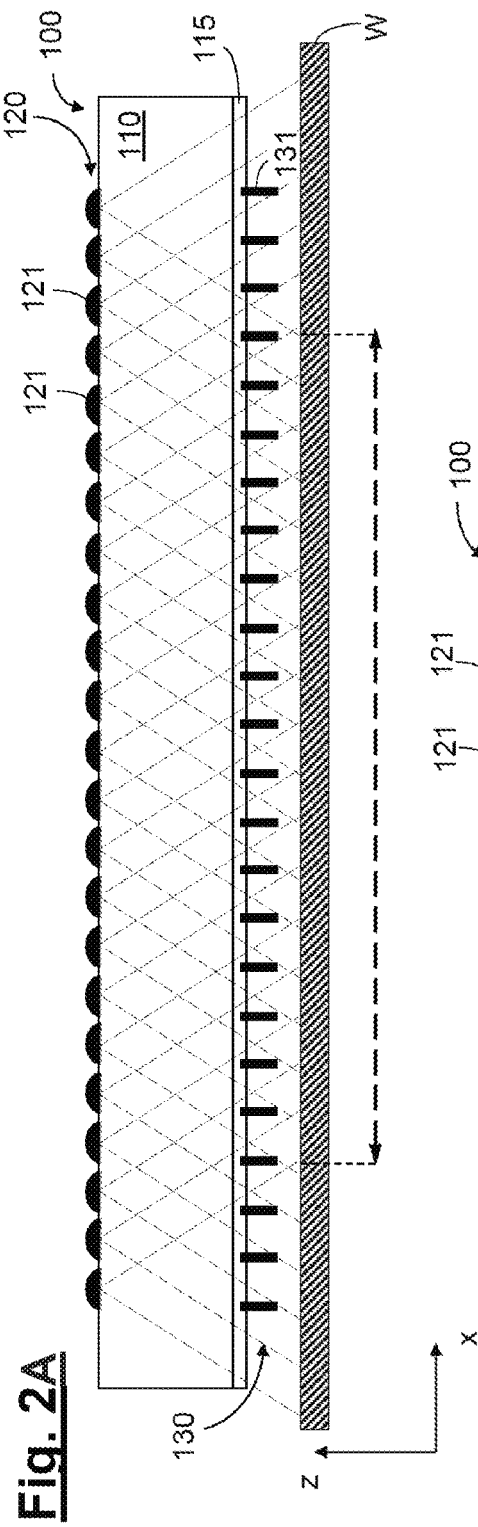
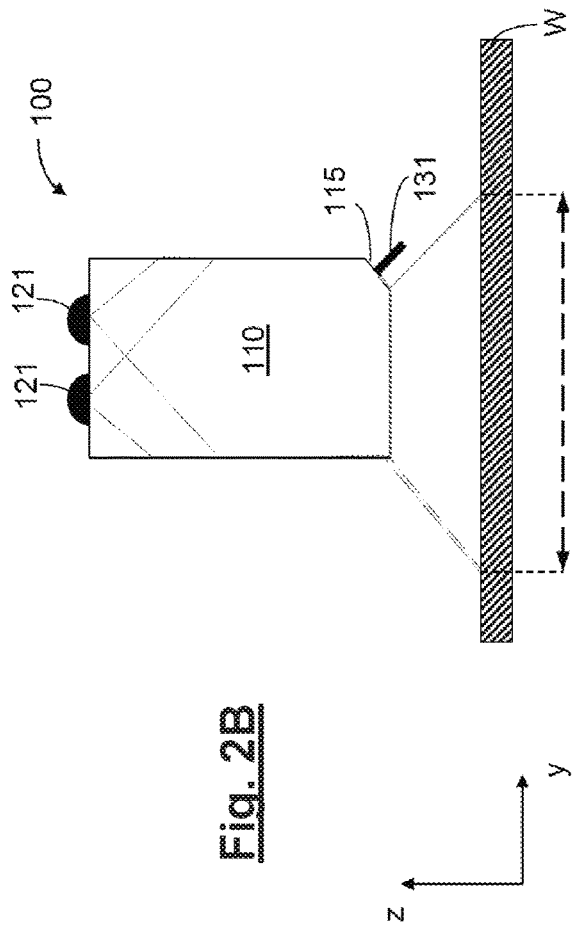

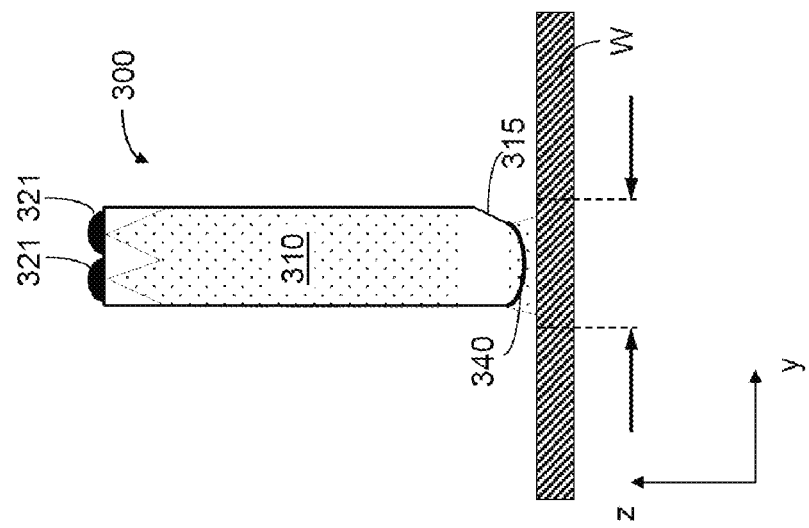
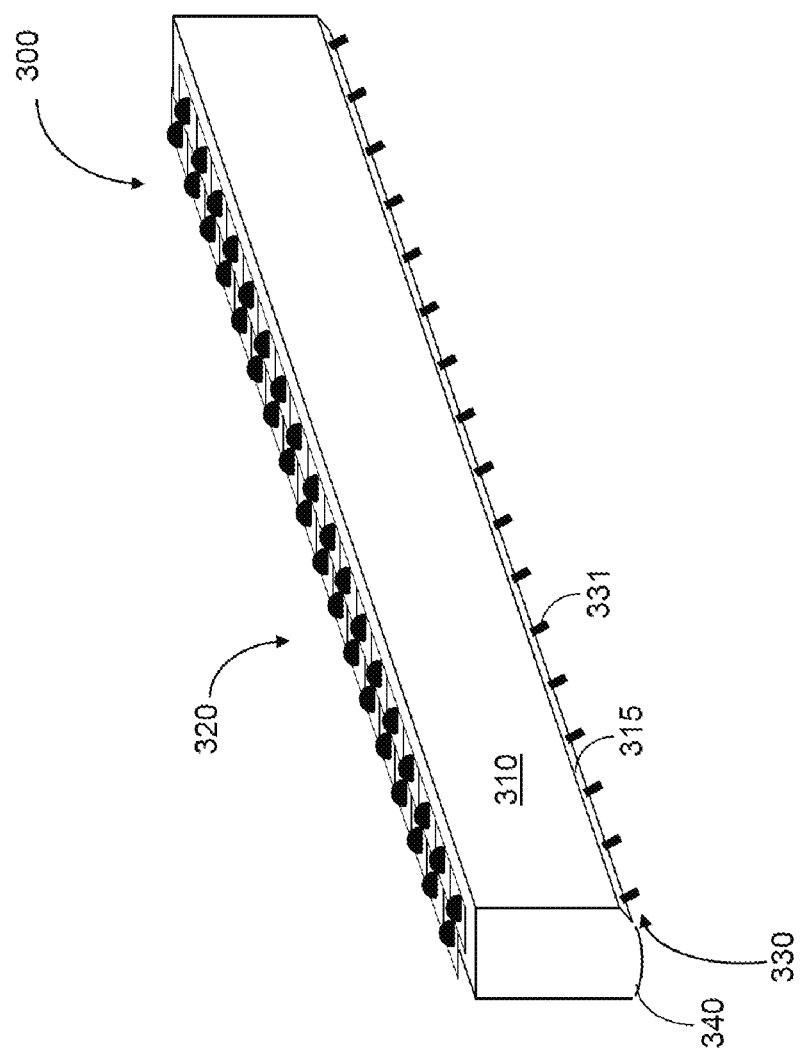

MICROLITHOGRAPHIC ILLUMINATION UNIT

CROSS-REFERENCE TO RELATED APPLICATIONS

The present application is a continuation of, and claims benefit under 35 USC 120 to, international application PCT/EP2017/062748, filed May 26, 2017, which claims benefit under 35 USC 119 of German Application No. 10 2016 211 511.1 filed on Jun. 27, 2016. The entire disclosure of these applications are incorporated by reference herein.

FIELD

The disclosure relates to a microlithographic illumination unit for post-exposure of a photoresist provided on a wafer in a microlithography process.

BACKGROUND

Microlithography is used for producing microstructured components such as, for example, integrated circuits or LCDs. The microlithography process is carried out in a so-called projection exposure apparatus including an illumination device and a projection lens. The image of a mask (reticle) illuminated via the illumination device is in this case projected via the projection lens onto a substrate (for example a silicon wafer) coated with a light-sensitive layer (photoresist) and arranged in the image plane of the projection lens, in order to transfer the mask structure to the light-sensitive coating of the substrate.

It is known here to perform in the microlithography process a structure-less illumination (i.e. without use of a structured mask) of the wafer or of the photoresist located thereon in each case after the individual lithography steps for increasing the sensitivity of the photo-resist for the purposes of efficient utilization of the electromagnetic radiation. Only by way of example, it is possible to use UV radiation with a wavelength of 365 nm in the process, wherein the respective illumination of the photoresist which is performed without transferring mask structures is typically effected with an intensity distribution which either is homogeneous or varies over comparatively large spatial wavelengths (e.g. of less than 1 mm) with only small amplitude fluctuations (e.g. less than 10%).

As a result, it is possible due to this additional illumination (which can also be referred to as "post-exposure" of the photoresist) to obtain better utilization of the (e.g. EUV) radiation that is radiated in the actual lithography steps and thus increased throughput of the microlithographic projection exposure apparatus.

Reference is made merely by way of example to S. Tagawa et. al: "Super High Sensitivity Enhancement by Photo-Sensitized Chemically Amplified Resist (PS-CAR) Process", Journal of Photopolymer Science and Technology, 26, 6, (2013), 825.

In order to be able to perform the above-described additional illumination or "post-exposure" of the photoresist, an additional illumination unit is involved, the configuration of which with respect to the existing desired performance properties in terms of intensity, uniformity and dose stability of the electromagnetic radiation that is coupled into the photoresist during this post-exposure represents an ambitious challenge.

SUMMARY

The present disclosure seeks to provide a microlithographic illumination unit which, with comparatively simple construction, allows a possibly particularly homogeneous post-exposure, which is as controlled as possible, of a photoresist situated on a wafer for increasing the throughput in the microlithography process.

The disclosure provides a microlithographic illumination unit for post-exposure of a photoresist provided on a wafer in a microlithography process. The unit includes:

at least one light source, and a light-guiding and light-mixing element for coupling the electromagnetic radiation generated by the light source into the photoresist, wherein this light-guiding and light-mixing element has a first pair of mutually opposite side faces, the maximum spacing of which has a first value, wherein multiple reflections of the electromagnetic radiation on these side faces take place;

wherein the light-guiding and light-mixing element has a second pair of mutually opposite side faces, the maximum spacing of which has a second value; and wherein the maximum extent of the light-guiding and light-mixing element in the light propagation direction of the electromagnetic radiation has a third value, wherein this third value is greater than the first value and is smaller than the second value.

According to one embodiment, the second value is greater than the first value at least by a factor of two, in particular at least by a factor of five, more particularly at least by a factor of ten.

The disclosure is based in particular on the concept of implementing an illumination unit for the post-exposure of the photoresist in the lithography process or after the individual lithography steps in a manner such that the electromagnetic radiation used for this post-exposure is coupled in via a light-guiding and light-mixing element, the dimensions of which are selected to be appropriate especially for obtaining the desired (specifically both light-guiding and light-mixing or homogenizing) effect.

The effect of the element according to the disclosure as a lightguide is here in particular that the working distance between the light source and the wafer that is to be observed during the post-exposure can be selected to be comparatively large, with the result that firstly undesired introductions of heat, owing to the power dissipation into the wafer or photoresist produced in the light source (e.g. an LED arrangement), and also undesired influences on or changes in the microelectronic circuits, produced on the wafer, due to electric fields of the driver electronics of the light source are avoided.

Another advantage of the configuration according to the disclosure lies in the avoidance or decrease of undesired contamination of the wafer during the post-exposure according to the disclosure, since reliable separation between the light source (e.g. LED arrangement) used for producing the electromagnetic radiation and the wafer becomes implementable.

According to the disclosure, an effect is effectively attained that corresponds to a "constriction" of the radiation used for post-exposure along the comparatively short extent of the light-guiding and light-mixing element, without comparatively complicated and costly fixing of additional optical elements on the light source or light sources becoming necessary herefor.

As a result, the illumination unit according to the disclosure is used to achieve a combination of the two desired effects of light guiding to the wafer and also the light mixing or light homogenization, wherein undesired influences on the already (at least partially) structured wafer are avoided at the same time.

According to one embodiment, the electromagnetic radiation is not reflected at the side faces of the second pair.

According to one embodiment, the light-guiding and light-mixing element is configured in the form of a solid block made of a material that is transparent for the electromagnetic radiation.

According to one embodiment, the multiple reflections at the side faces of the first pair include at least one total internal reflection.

According to one embodiment, the side faces of the first pair are mirror surfaces.

According to one embodiment, the side faces of the first pair are not arranged so as to be parallel with one another.

According to one embodiment, the illumination unit has at least one intensity sensor for measuring the electromagnetic radiation.

According to one embodiment, the illumination unit has a light source arrangement composed of a plurality of light sources.

According to one embodiment, the light-guiding and light-mixing element has a light exit surface that is provided with refractive power.

According to one embodiment, the light-guiding and light-mixing element has a light exit surface that is provided with a diffractive or refractive structure.

The disclosure furthermore relates to a microlithographic projection exposure method, wherein the method includes the following steps:
  providing a substrate on which at least partially a photoresist is applied;
  providing a microlithographic projection exposure apparatus having an illumination device and a projection lens;
  projecting in each case one mask structure onto a region of the photoresist by way of the projection exposure apparatus in a plurality of projection steps; and
  wherein after at least one of these projection steps, a post-exposure of the photoresist using an illumination unit having the previously described features takes place.

Further configurations of the disclosure can be gathered from the description and the dependent claims.

The disclosure is explained in greater detail below on the basis of exemplary embodiments illustrated in the accompanying figures.

BRIEF DESCRIPTION OF THE DRAWINGS

In the figures:
FIGS. 1-6 show schematic illustrations for explaining various embodiments of the disclosure.

DETAILED DESCRIPTION OF PREFERRED EMBODIMENTS

Figure 7:
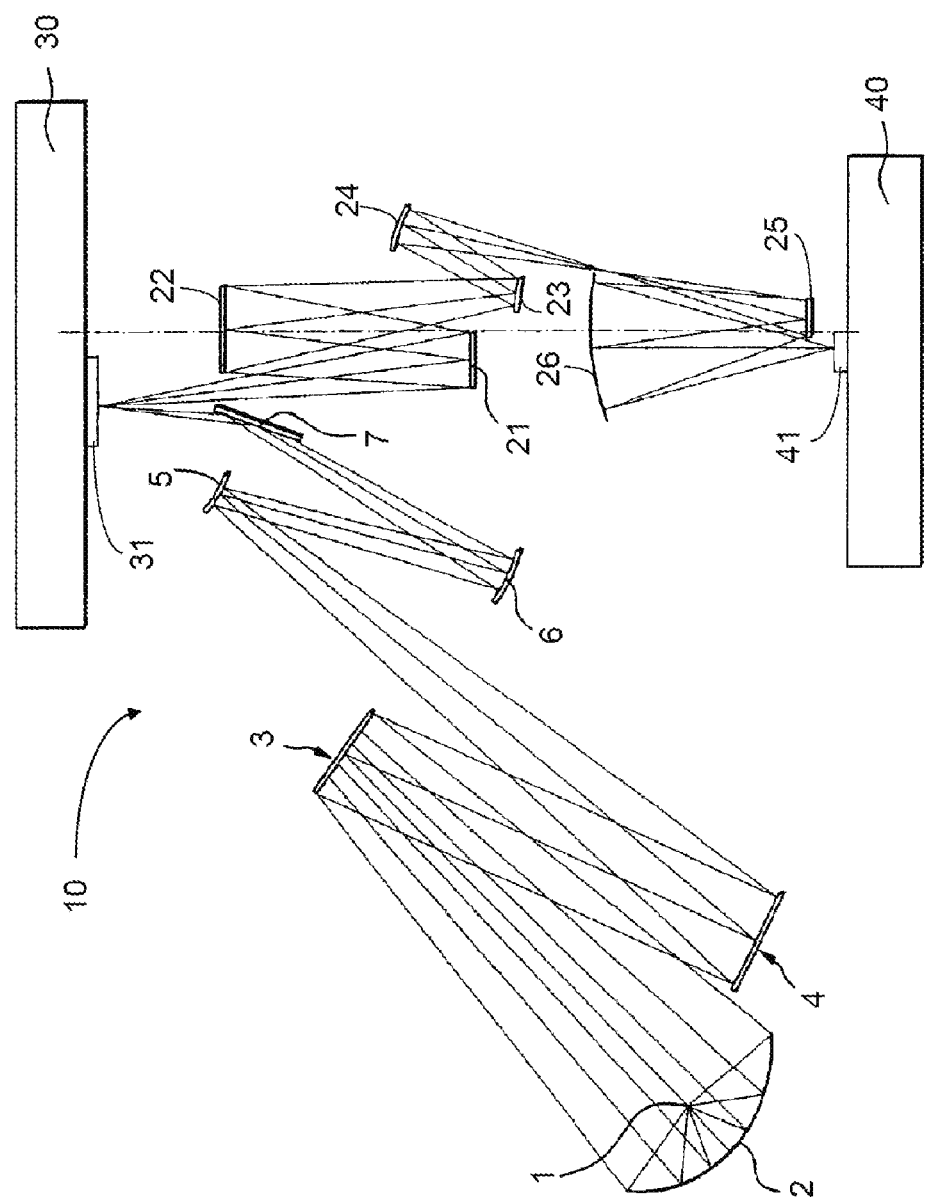
FIG. 7 shows a schematic illustration for explaining the possible construction of a microlithographic projection exposure apparatus designed for operation in the EUV range.

FIG. 7 shows a schematic illustration of a projection exposure apparatus that is given by way of example and is designed for operation in the EUV range.

According to FIG. 7, an illumination device in a projection exposure apparatus 10 designed for EUV includes a field facet mirror 3 and a pupil facet mirror 4. The light from a light source unit including a plasma light source 1 and a collector mirror 2 is directed onto the field facet mirror 3. A first telescope mirror 5 and a second telescope mirror 6 are arranged in the light path downstream of the pupil facet mirror 4. A deflection mirror 7 is arranged downstream in the light path, the deflection mirror directing the radiation that is incident on it onto an object field in the object plane of a projection lens including six mirrors 21-26. At the location of the object field, a reflective structure-bearing mask 31 is arranged on a mask stage 30, the mask being imaged with the aid of the projection lens into an image plane in which a substrate 41 coated with a light-sensitive layer (photoresist) is situated on a wafer stage 40.

Different embodiments of an illumination unit according to the disclosure that is used to perform a post-exposure (already explained in the introductory part) of the photoresist or wafer after the individual lithography steps will now be described below. By way of this "post-exposure", it is possible to obtain better utilization of the (e.g. EUV) radiation that is radiated in the actual lithography steps and thus increased throughput of the microlithographic projection exposure apparatus.

First, the construction and function of an illumination unit according to the disclosure in a first embodiment will be explained with reference to the schematic images of FIG. 1 and FIG. 2A-2B.

According to FIG. 1, an illumination unit 100 according to the first embodiment has a light-guiding and light-mixing element 110, which, in the exemplary embodiment, but without the disclosure being limited thereto, is configured in the form of a block which is sufficiently transparent for the wavelength range of the electromagnetic radiation used in the post-exposure according to the disclosure (that is to say e.g. for a wavelength of 365 nm).

In the exemplary embodiment, this block or the light-guiding and light-mixing element 110 is made of quartz glass ($SiO_2$). In further embodiments, a different, suitable material that is transparent for the relevant wavelength, e.g. calcium fluoride ($CaF_2$), can also be used.

The illumination unit 100 furthermore has a light source arrangement 120, which in the exemplary embodiment is in the form of an arrangement of a multiplicity of LEDs 121, wherein these LEDs 121 in turn in the exemplary embodiment are mounted on a side face, representing the light entry surface, of the block that forms the light-guiding and light-mixing element 110.

As can be seen best from FIG. 2A-2B, the electromagnetic radiation that is emitted by the LEDs 121 and enters the transparent block is guided by (nearly loss-free) total internal reflection in the direction of the substrate or wafer W.

The block that forms the light-guiding and light-mixing element 110 is here arranged with respect to the light propagation direction or the position of the wafer W in a manner such that it has a spatial extent in one spatial direction (according to FIG. 2A, in the x-direction) which is greater relative to the distance between the light source 120 or LEDs 121 and the wafer W, and a spatial extent that is shorter relative thereto in the spatial direction which is perpendicular thereto (according to FIG. 2B, in the y-direction).

This configuration causes the divergence of the light rays emerging from the LEDs 121 of the light source arrangement 120 (which can correspond, merely by way of example, to a half aperture angle of 30°) in the spatial direction (y-direction), which corresponds to the comparatively short extent of the block that forms the light-guiding and light-mixing element 110, via total internal reflection on the side faces of the block that are mutually opposite one another in this direction to result in an efficient or substantially loss-free light guidance up to the proximity of the wafer W according to FIG. 2B.

In contrast, in the spatial direction having a comparatively large extent of the block (x-direction), no reflection takes place on the side faces of the block that are mutually opposite in this direction, wherein to this extent, good mixing of the rays emerging from the individual LEDs 121 according to FIG. 2A is achieved.

The disclosure is not limited to the above-described implementation of the light-guiding and light-mixing element 110 as a transparent block. For example, the relevant element 110 in further embodiments can also be configured in the form of a housing made of mutually opposite side walls that form an enclosure for light which passes through, wherein the side walls responsible for the reflection according to FIG. 2B are reflective.

The illumination unit 100 furthermore has a sensor arrangement 130 which in the exemplary embodiment is formed from a multiplicity of photodiodes 131 which are arranged along a bevelled face or chamfer 115 that is provided on the block that forms the light-guiding and light-mixing element 110 and serve to monitor the intensity of the electromagnetic radiation emitted by the respective LEDs 121. In this way, the brightness of the individual LEDs 121 can be adjusted, independently of one another, in accordance with the respective current desired properties using an additional controller.

This controller makes it advantageously possible in particular to switch off the LEDs 121 (and thus e.g. to avoid undesired scattered light) in phases of interruption of the lithography process (e.g. during a wafer change), because constant maintenance of a thermal equilibrium of the LEDs 121 over a continuous operation of the LEDs 121 is not necessary.

Another advantage of the previously described monitoring of the brightness of the LEDs 121 is that any defects of individual LEDs can be immediately detected, with the result that, if desired, the post-exposure according to the disclosure can be interrupted to avoid inhomogeneous illumination and any associated damage to the wafer W.

The disclosure is not limited to the implementation of the light source arrangement 120 in the form of the previously described arrangement of LEDs 121. In further embodiments, other suitable light sources, such as e.g. discharge lamps, can also be arranged in a similar fashion. Furthermore, a single (e.g. strip-shaped) light source can also be used.

FIG. 3A-3B show a further embodiment of the disclosure, wherein components which are analogous or substantially have the same function are denoted by reference signs increased by "200" in relation to FIG. 1.

The embodiment of FIG. 3A-3B differs from that of FIG. 1 and FIG. 2A-2B in that the light exit surface 340, facing the wafer W, of the block that forms the light-guiding and light-mixing element 310 is provided with refractive power. In the exemplary embodiment of FIG. 3A-3B, the light exit surface 340 is to this end provided with a cylindrical geometry. In further embodiments, the desired refractive power can also be implemented by way of a cylindrical asphere or by configuring the light exit surface 340 in the form of a Fresnel lens or with a diffractive structure.

The refractive power at the light exit surface 340 results in collimation of the electromagnetic radiation, which exits the block that forms the light-guiding and light-mixing element 310, along the y-direction with the result that it is possible to further increase the ratio of the working distance between light exit surface 340 and wafer W and the extent of the illumination in the y-direction (according to the displacement direction of the wafer). It is thus possible to increase the distance of the illumination unit 300 from the wafer W without a need to further widen the lighting in the y-direction.

Figure 4B:
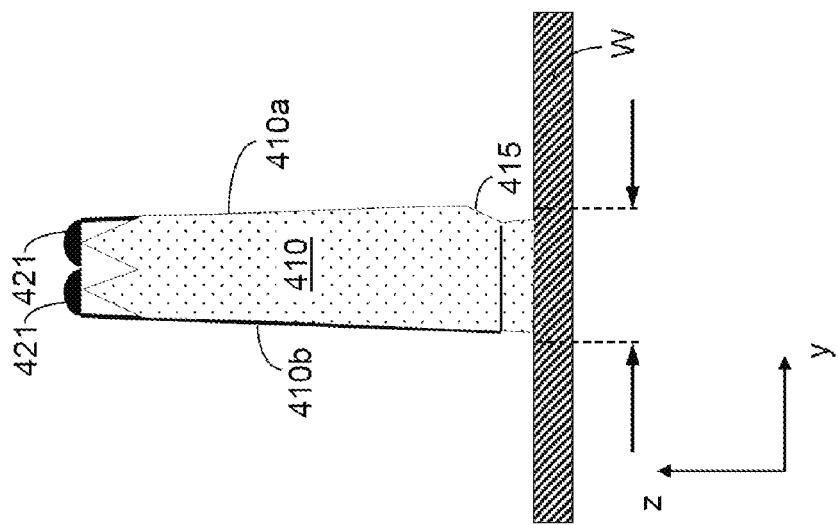
Figure 4A:
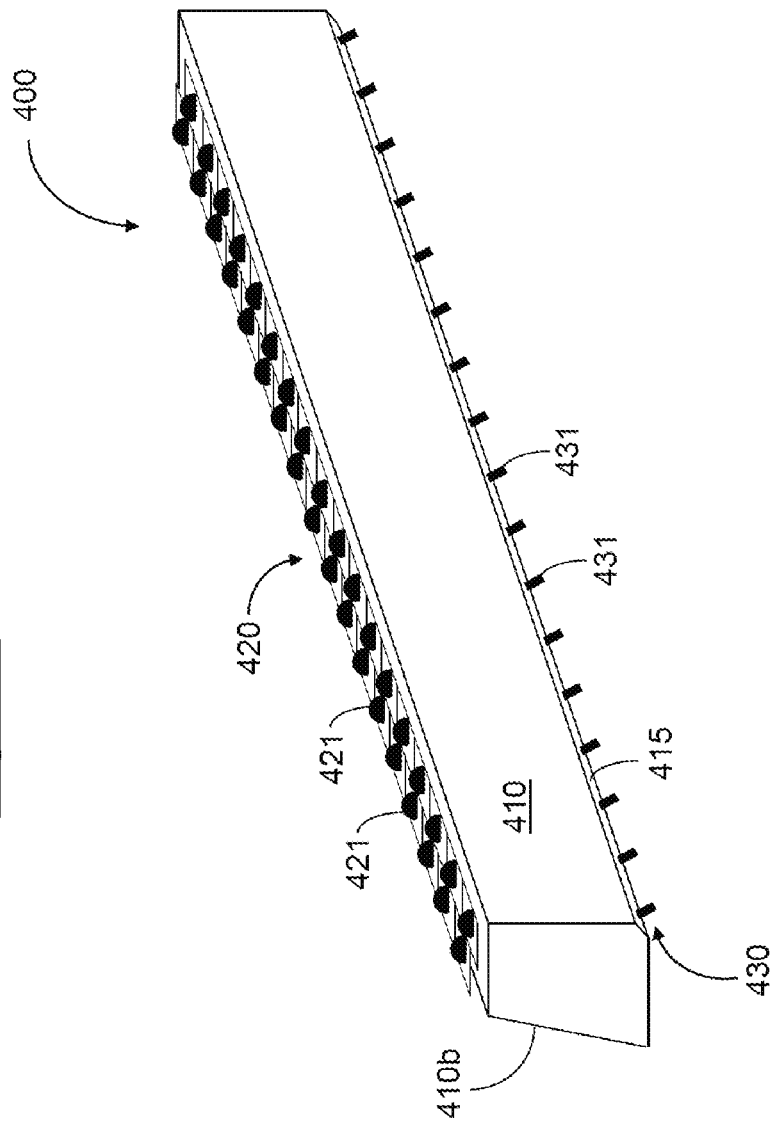

FIG. 4A-4B show a further embodiment, wherein, once again, components which are analogous or substantially have the same function are denoted by reference signs increased by "100" in relation to FIG. 3A-3B.

The embodiment of FIG. 4A-4B differs from that from FIG. 1 and FIG. 2A-2B in that the two side faces 410$a$, 410$b$ of the light-guiding or light-mixing element 410 that are mutually opposite one another in the y-direction are not aligned to be mutually parallel, but tilted about a finite angle. The result of this configuration is that with each reflection of the electromagnetic radiation at one of the side faces 410$a$, 410$b$, the angle of the electromagnetic radiation relative to the z-direction is changed, with the result that a collimation of the beam path in the y-direction is likewise achieved and thus, analogously to FIG. 3A-3B, an increase of the working distance of the light exit surface of the element 410 from the wafer W is made possible.

Figure 6:
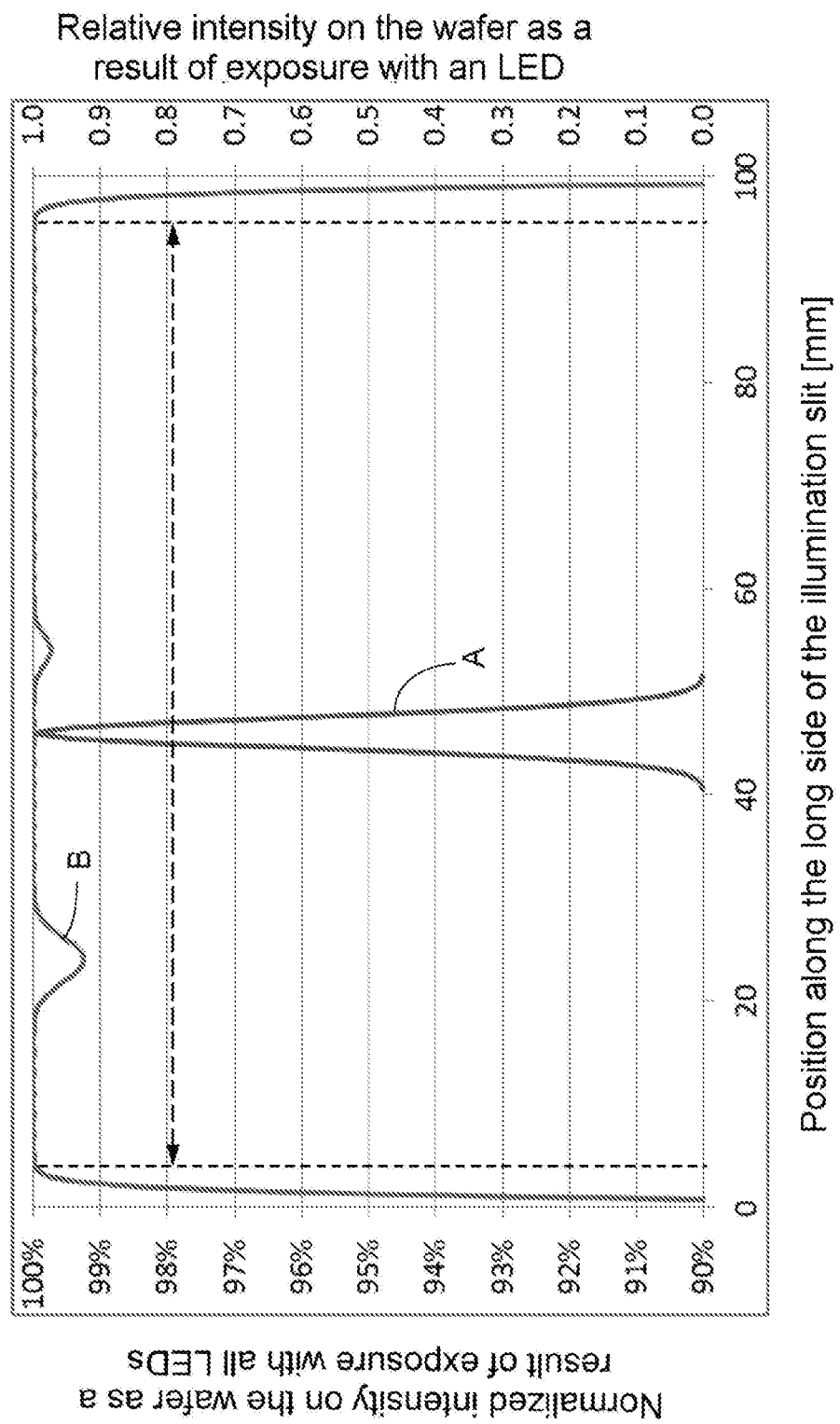

The diagram shown in FIG. 6, which shows the result of a simulation of the lighting of a photoresist or wafer with an illumination unit according to the disclosure, is intended to indicate that in principle, any desired intensity distributions are settable with an illumination unit according to the disclosure in accordance with the previously described embodiments.

Here, curve "A" shows a Gaussian distribution with which the intensity distribution produced by a single LED of the light source arrangement along the x-direction can be described. Curve "B" (likewise plotted along the x-direction) shows an exemplary profile which is attainable by superposition or summation of the intensities of all the LEDs in the light source arrangement along the x-direction (i.e. over the "long side of the illumination slit"), wherein the recognizable local minima were adjusted in a targeted fashion by dimming individual LEDs. Without such dimming, it is also thus possible to implement a substantially constant intensity profile over the photoresist.

Figure 5:
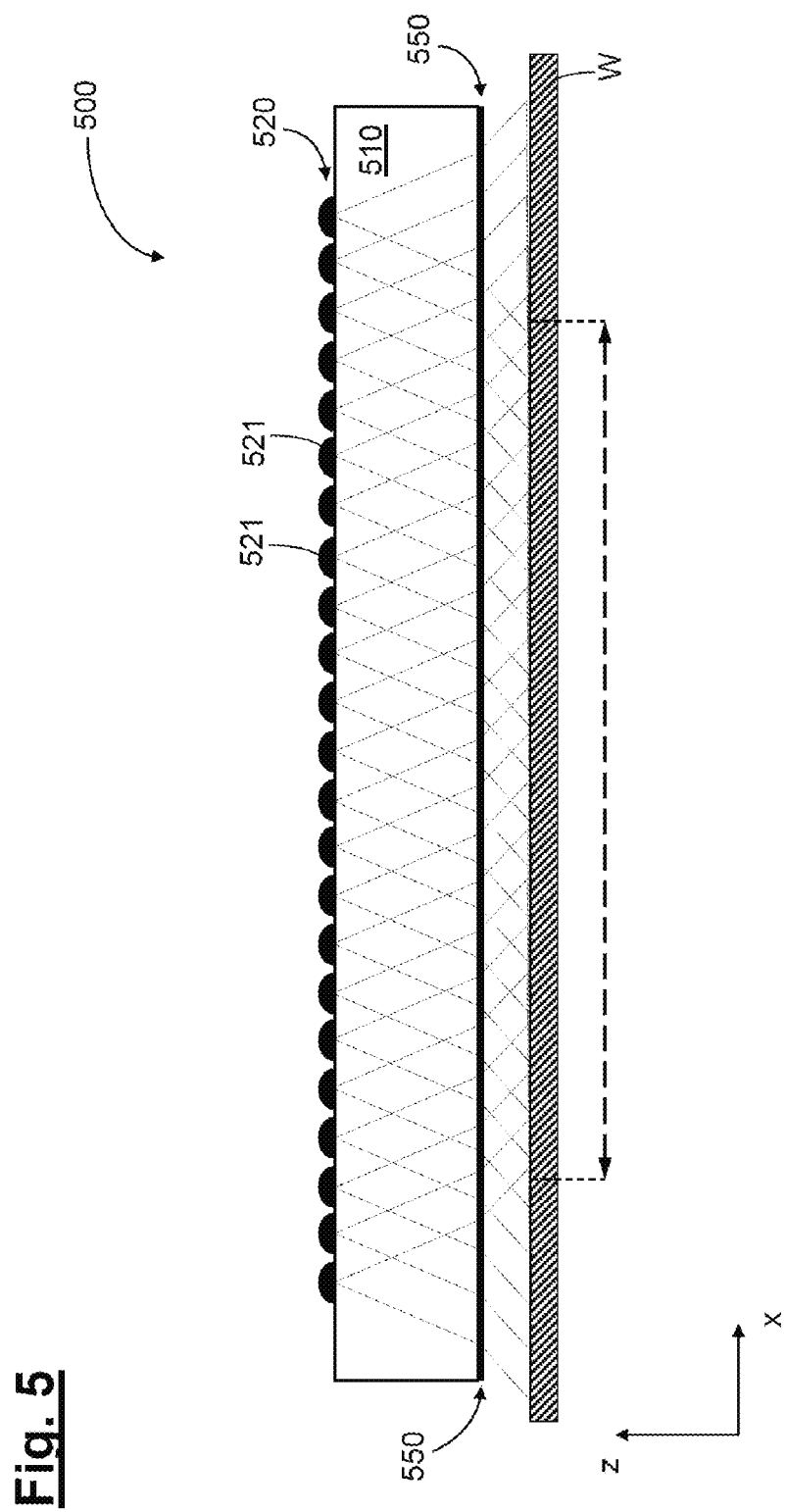

FIG. 5 shows a schematic illustration of an illumination unit 500 according to a further embodiment, wherein, once again, components analogous or substantially functionally identical to FIG. 4A-4B are designated by reference numerals increased by "100".

The embodiment according to FIG. 5 differs from that from FIG. 1 and FIG. 2A-2B in that a structure 550, which scatters along the x-direction (one-dimensionally), is formed on the light exit surface, facing the wafer W, of the block that forms the light-guiding and light-mixing element 510, as a result of which lighting of the wafer W can be smeared along the x-direction or the spatial direction with greater extent of the element 510 and thus further homogenization of the lighting can be obtained. The structure 550 serving as a diffusing screen can be configured as a diffractive structure or from e.g. small lens elements (according to a refractive effect).

Even though the disclosure has been described on the basis of specific embodiments, numerous variations and alternative embodiments are apparent to the person skilled in the art, e.g. by combination and/or exchange of features of individual embodiments. Accordingly, it goes without saying for the person skilled in the art that such variations and alternative embodiments are concomitantly encompassed by the present disclosure, and the scope of the disclosure is restricted only within the meaning of the accompanying patent claims and the equivalents thereof.

What is claimed is:

1. A microlithographic illumination unit configured to be used in post-exposure of a photoresist provided supported by a wafer in a microlithography process, comprising:
 a light source configured to generate electromagnetic radiation; and
 a light-guiding and light-mixing element configured to couple the electromagnetic radiation into the photoresist supported by the wafer,
 wherein:
  the light-guiding and light-mixing element has first, second, third and fourth sides;
  the first side is opposite the second side;
  the third side is opposite the fourth side;
  a maximum spacing between the first and second sides has a first value;
  a maximum spacing between the third and fourth sides has a second value;
  the microlithographic illumination unit is configured so that, during use, multiple reflections of the electromagnetic radiation occur on the first and second sides;
  a maximum extent of the light-guiding and light-mixing element in a light propagation direction of the electromagnetic radiation has a third value;
  the third value is greater than the first value; and
  the third value is less than the second value.

2. The microlithographic illumination unit of claim 1, wherein the second value is at least two times greater than the first value.

3. The microlithographic illumination unit of claim 1, wherein the microlithographic illumination unit is configured so that, during use, the electromagnetic radiation is not reflected at the third side or the fourth side.

4. The microlithographic illumination unit of claim 1, wherein the light-guiding and light-mixing element comprises a solid block comprising a material that is transparent for the electromagnetic radiation.

5. The microlithographic illumination unit of claim 1, wherein the multiple reflection at the first and second sides comprises an internal reflection.

6. The microlithographic illumination unit of claim 1, wherein the first side comprises a mirror surface, and the second side comprises a mirror surface.

7. The microlithographic illumination unit of claim 1, wherein the first and second sides are parallel to each other.

8. The microlithographic illumination unit of claim 1, further comprising an intensity sensor configured to measure the electromagnetic radiation.

9. The microlithographic illumination unit of claim 1, further comprising a light source arrangement comprising a plurality of light sources.

10. The microlithographic illumination unit of claim 1, wherein the light-guiding and light-mixing element comprises a light exit surface having refractive power.

11. The microlithographic illumination unit of claim 1, wherein the light-guiding and light-mixing element comprises a light exit surface comprising a diffractive structure.

12. The microlithographic illumination unit of claim 1, wherein the light-guiding and light-mixing element comprises a light exit surface comprising a refractive structure.

13. The microlithographic illumination unit of claim 1, wherein:
 the second value is at least two times greater than the first value; and
 the microlithographic illumination unit is configured so that, during use, the electromagnetic radiation is not reflected at the third side or the fourth side.

14. The microlithographic illumination unit of claim 1, wherein:
 the second value is at least two times greater than the first value; and
 the light-guiding and light-mixing element comprises a solid block comprising a material that is transparent for the electromagnetic radiation.

15. The microlithographic illumination unit of claim 1, wherein:
 the second value is at least two times greater than the first value; and
 the multiple reflection at the first and second sides comprises an internal reflection.

16. The microlithographic illumination unit of claim 1, wherein:
 the second value is at least two times greater than the first value;
 the first side comprises a mirror surface; and
 the second side comprises a mirror surface.

17. The microlithographic illumination unit of claim 1, wherein:
 the second value is at least two times greater than the first value; and
 the first and second sides are parallel to each other.

18. The microlithographic illumination unit of claim 1, further comprising:
 an intensity sensor configured to measure the electromagnetic radiation; and
 a light source arrangement comprising a plurality of light sources.

19. A system comprising:
 a microlithographic projection exposure apparatus, comprising:
  an illumination device; and
  a projection lens; and
 a microlithographic illumination unit according to claim 1.

20. A method, comprising:
 using a projection lens of a microlithographic projection exposure apparatus to a mask structure onto a region of photo-resist in a plurality of projection steps; and
 after at least one of the projection steps, using an illumination unit according to claim 1 in a post-exposure step.

* * * * *

UNITED STATES PATENT AND TRADEMARK OFFICE
CERTIFICATE OF CORRECTION

PATENT NO. : 10,394,129 B2
APPLICATION NO. : 16/208662
DATED : August 27, 2019
INVENTOR(S) : Markus Deguenther and Stig Bieling Page 1 of 1

It is certified that error appears in the above-identified patent and that said Letters Patent is hereby corrected as shown below:

In the Specification

Column 4, Line 27, please delete "FIG." and insert --FIGS.--, therefor.

Column 4, Line 48, please delete "FIG." and insert --FIGS.--, therefor.

Column 5, Line 55, please delete "FIG." and insert --FIGS.--, therefor.

Column 5, Line 56, please delete "FIG." and insert --FIGS.--, therefor.

Column 5, Line 59, please delete "FIG." and insert --FIGS.--, therefor.

Column 6, Line 9, please delete "FIG." and insert --FIGS.--, therefor.

Column 6, Line 12, please delete "FIG." and insert --FIGS.--, therefor.

Column 6, Line 13, please delete "FIG." and insert --FIGS.--, therefor.

Column 6, Line 14, please delete "FIG." and insert --FIGS.--, therefor.

Column 6, Line 23, please delete "FIG." and insert --FIGS.--, therefor.

Column 6, Line 48, please delete "FIG." and insert --FIGS.--, therefor.

Column 6, Line 51, please delete "FIG." and insert --FIGS.--, therefor.

Signed and Sealed this
Tenth Day of December, 2019

Andrei Iancu
*Director of the United States Patent and Trademark Office*